US005691664A

United States Patent [19]

Anderson et al.

[11] Patent Number: 5,691,664
[45] Date of Patent: Nov. 25, 1997

[54] PROGRAMMABLE ANALOG ARRAY AND METHOD FOR ESTABLISHING A FEEDBACK LOOP THEREIN

[75] Inventors: David J. Anderson, Scottsdale; Danny A. Bersch, Gilbert, both of Ariz.

[73] Assignee: Motorola, Inc., Schaumburg, Ill.

[21] Appl. No.: 586,503

[22] Filed: Jan. 16, 1996

[51] Int. Cl.$^6$ .............................. H03K 3/26; H01L 25/00
[52] U.S. Cl. ............................ 327/565; 327/564; 326/38; 326/41
[58] Field of Search ............................ 327/564–566; 326/38, 39, 41, 47

[56] References Cited

U.S. PATENT DOCUMENTS

| | | |
|---|---|---|
| 4,642,487 | 2/1987 | Carter . |
| 5,055,710 | 10/1991 | Tanaka et al. ............... 326/47 |
| 5,196,740 | 3/1993 | Austin . |

FOREIGN PATENT DOCUMENTS 61-101050  5/1986  Japan ........................ 327/564

*Primary Examiner*—Timothy P. Callahan
*Assistant Examiner*—T. T. Lam
*Attorney, Agent, or Firm*—Zyie Zhou; Rennie William Dover

[57] ABSTRACT

A programmable analog array (10) comprises an array of configurable cells (11), each cell (11) including analog circuitry (12) and digital circuitry (14). The cells (11) are configured for a particular functional application. The digital circuitry (14) converts an analog signal generated by the analog circuitry (12) into digital control information, which is then used to adjust the analog circuitry (12). Therefore, the analog circuitry (12) and the digital circuitry (14) form a digital feedback loop. The digital feedback loop is established either within a single cell or among neighboring cells. Thus, the digital feedback loop is established without using a global data bus.

20 Claims, 3 Drawing Sheets

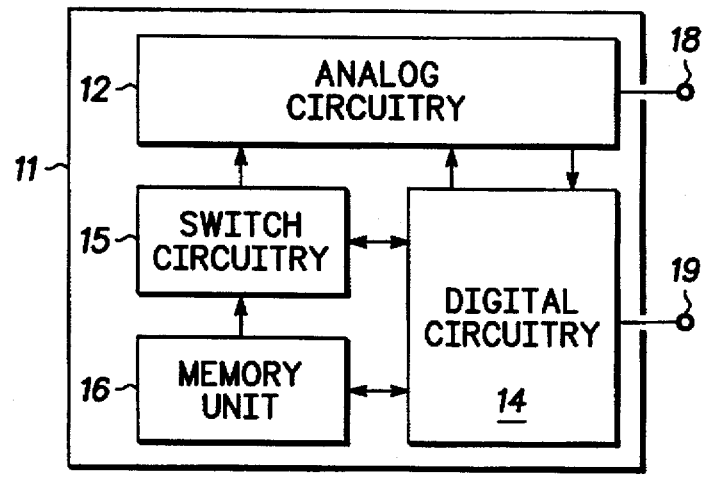
FIG. 2
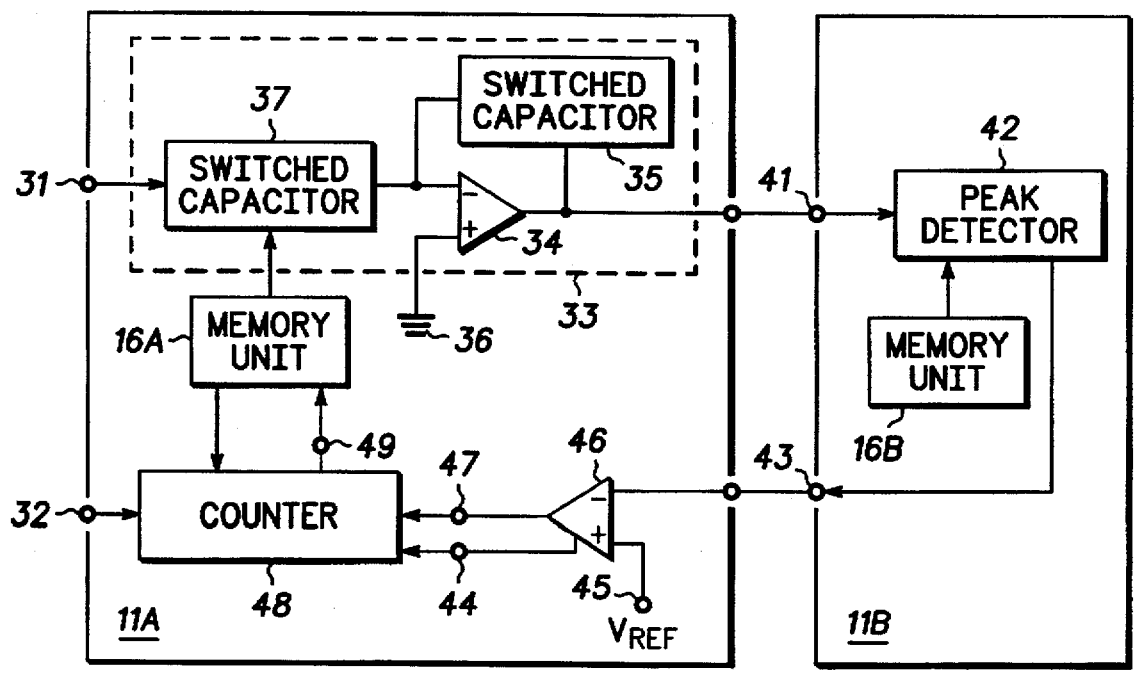
30  FIG. 3

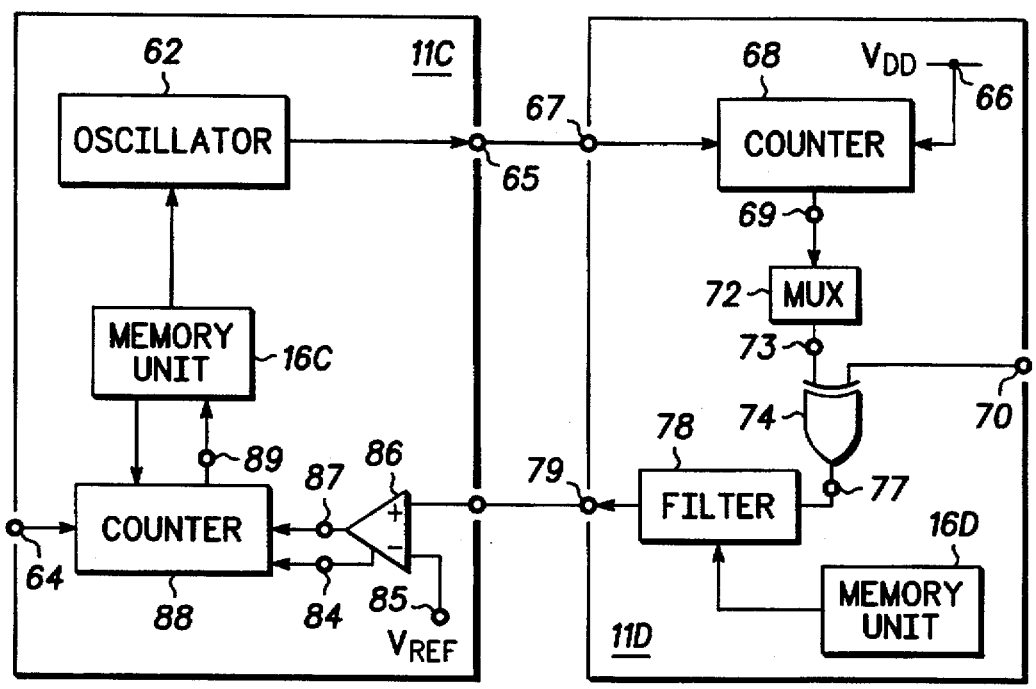
*60* FIG. 4
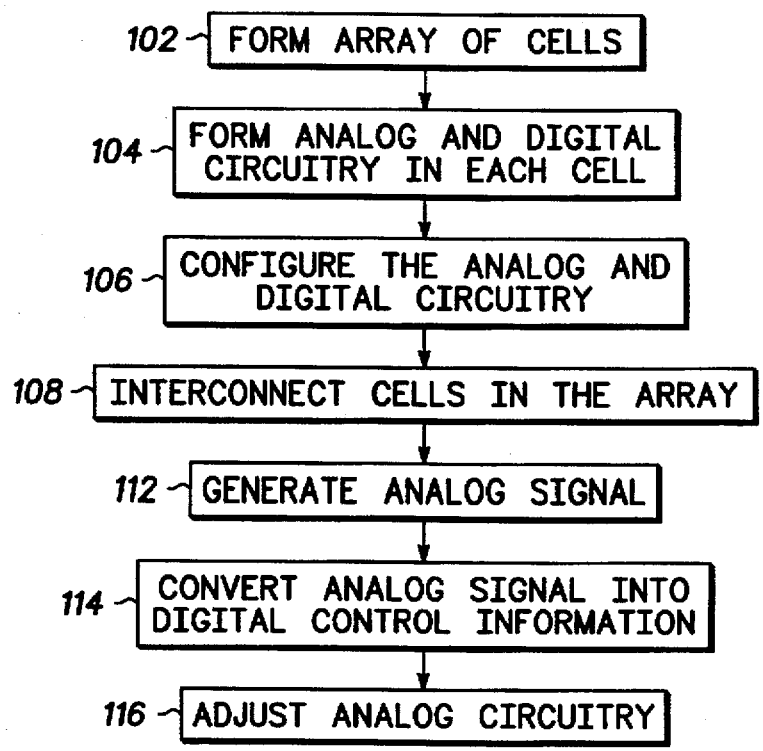
*100* FIG. 5

5,691,664

PROGRAMMABLE ANALOG ARRAY AND METHOD FOR ESTABLISHING A FEEDBACK LOOP THEREIN

BACKGROUND OF THE INVENTION

The present invention relates, in general, to semiconductor integrated circuits and, more particularly, to semiconductor integrated circuits which are configurable for a wide range of functional applications.

Integrated circuits are popular in electronics applications because they are more compact and reliable than discrete components mounted on printed circuit boards. Many integrated circuits are designed and manufactured exclusively for a particular application. The process of designing a new integrated circuit and implementing a new design in wafer production is usually very costly.

One approach for reducing cost is to develop semiconductor integrated circuits which are configurable for a wide range of functional applications without the requirement for any major change in the manufacturing processes of the integrated circuits. One such integrated circuit comprises an array of configurable analog cells. Each cell is capable of being internally configured in accordance with cell configuration data and being interconnected with other cells in the array through interconnection circuitry. The configuration of an analog cell can be achieved using switched capacitor technology. The array can implement different analog functional applications such as amplifiers, filters, rectifiers, oscillators, etc. by using different internal configurations of the cells in the array and different interconnections among cells in the array. Achieving feedback for such functions as an automatic gain control loop in an amplifier requires the configuration information of the amplifier to be updated dynamically. In order to establish a feedback loop for the array, an analog signal, such as the signal at the output of an amplifier configured in the array, is transmitted to a custom designed circuit outside the array. The custom designed circuit converts the analog signal into a digital configuration signal, which is transmitted back to the array by a global data bus. However, transmitting signals between the analog cells in the array and the circuit outside the array is slow and requires a large global data bus. For example, establishing a feedback loop to control a switched capacitor circuit having eight bit programmable capacitors requires an eight bit parallel data bus. Thus, for an array of cells arranged in seven rows and seven columns, controlling a switched capacitor circuit in each cell requires a parallel global data bus as large as 392 bits. In addition, the use of global buses reduces the bandwidth of signal transmission compared with local connections.

Accordingly, it would be advantageous to have a programmable analog array and a method for establishing a feedback loop. It is desirable for each cell in the array to include analog circuitry and digital circuitry so that a local feedback loop can be established within one cell or among neighboring cells in the array. It would be of further advantage for the feedback loop to be implemented within the programmable analog array and without using global data bus, thereby increasing the speed of signal transmission and reducing the size and manufacturing cost of the integrated circuit chip.

BRIEF DESCRIPTION OF THE DRAWINGS

FIG. 2 is a block diagram of a cell in the programmable analog array of FIG. 1;

FIG. 3 is a schematic diagram of an automatic gain control circuit implemented using two cells in the programmable analog array of FIG. 1;

FIG. 4 is a schematic diagram of a phase locked loop implemented using two cells in the programmable analog array of FIG. 1; and FIG. 5 is a flow chart of a method for establishing a feedback loop for use with the programable analog array of FIG. 1.

DETAILED DESCRIPTION OF THE DRAWINGS

Figure 1:
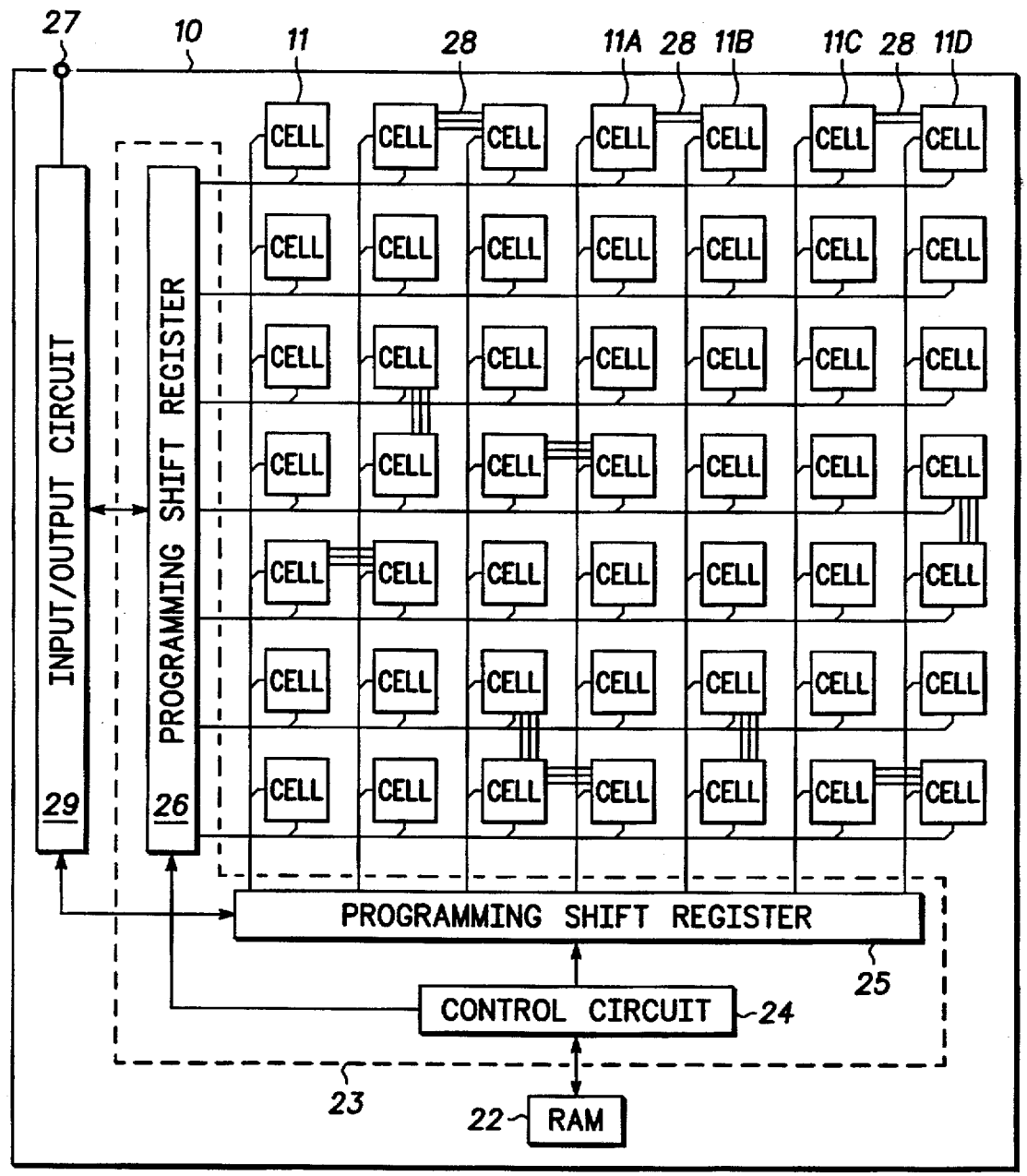
FIG. 1 is a block diagram of a programmable analog array in a representative arrangement in accordance with an embodiment of the present invention.

FIG. 1 is a block diagram of a programmable analog array 10 in a representative arrangement in accordance with an embodiment of the present invention. Programmable analog array 10 comprises an array of cells 11 arranged in seven rows and seven columns. Each cell 11 contains analog circuitry, digital circuitry, switch circuitry, and a memory unit, and will be further described with reference to FIG. 2. To implement a particular functional application, the switch circuitry configures the analog circuitry and digital circuitry in accordance with cell configuration data stored in the memory unit in each cell 11. The configuration of circuitry includes coupling various components of the circuitry to each other and assigning component values to the various components. Examples of component values include the capacitance of a switched capacitor, the gain of an amplifier, the intrinsic frequency of an oscillator, or the like.

Programmable analog array 10 also includes a data storage element such as a random access memory (RAM) 22. RAM 22 stores the cell configuration data for each cell 11 and the interconnection data for interconnecting different cells in programable analog array 10. The cell configuration data and the interconnection data stored in RAM 22 can be reconfigured from an external source (not shown in FIG. 1) in order to implement new functional applications for programmable analog array 10.

Programmable analog array 10 further includes an accessing circuit 23 for selecting and accessing cells 11. Accessing circuit 23 includes a control circuit 24 and programming shift registers 25 and 26. Programming shift registers 25 and 26 are under the control of control circuit 24. Programming shift register 25 provides a column coordinate reference signal, and programming shift register 26 provides a row coordinate reference signal. The column and row coordinate reference signals allow any cell 11 within programmable analog array 10 to be selected for access. After a cell 11 is selected, the cell configuration data stored in RAM 22 is transmitted to the memory unit in the selected cell 11 via accessing circuit 23.

Interconnection circuitry 28 establishes interconnection between different cells 11 in programmable analog array 10 in accordance with the interconnection data stored in RAM 22. For example, interconnection circuitry 28 may include a conducting metal network combined with switches. The interconnection data are continuously read by interconnection circuitry 28 to maintain the proper interconnection within programmable analog array 10.

Programmable analog array 10 further includes an input/output circuit 29. Input/output circuit 29 transmits analog signals between programmable analog array 10 and external circuitry (not shown in FIG. 1) via an input/output port 27.

Although programmable analog array 10 is described in FIG. 1 as including seven rows and seven columns of cells 11, this is not intended as a limitation of the present invention. Programmable analog array 10 may include any number of cells, e.g., eight rows and eight columns, four rows and five columns, etc., depending on its desired functional applications. In addition, it should be understood that the cells in the array of programmable analog array 10 are not limited to being identical to each other in the present invention. The array in programable analog array 10 may include cells which are structurally different from one another. For example, cells in the first, third, fifth, and seventh columns may be structurally identical to each other, whereas cells in the second, fourth, and sixth columns may be structurally identical to each other but structurally different from the cells in the first, third, fifth, and seventh columns.

FIG. 2 is a block diagram of a cell 11 in programmable analog array 10 of FIG. 1. Cell 11 includes analog circuitry 12, digital circuitry 14, switch circuitry 15, and a memory unit 16. Analog circuitry 12 may include an amplifier and an analog circuit element having internal components with variable connections such as a switched capacitor. Memory unit 16 receives the cell configuration data from RAM 22 via programing shift registers 25 and 26. Switch circuitry 15 maintains circuit configurations and component values in analog circuitry 12 and digital circuitry 14 to implement one of a plurality of circuit functions in accordance with the cell configuration data stored in memory unit 16. Nodes 18 and 19 are coupled to other cells in programable analog array 10 via interconnection circuitry 28. Digital circuitry 14 converts an analog signal received from analog circuitry 12 into digital control information. The digital control information is transmitted to memory unit 16 to update the cell configuration data, thereby altering the configuration and/or adjusting the component values in analog circuitry 12. Therefore, digital circuitry 14 and analog circuitry 12 form a digital feedback loop.

It should be understood that, in the present invention, the analog circuitry in one cell of cells 11 is not limited to forming a digital feedback loop with the digital circuitry in the same cell. A digital feedback loop may be formed among two or more cells in the programable analog array 10. It should also be understood that, in the present invention, the analog circuitry and the digital circuitry are not limited to being included in the same cell in the array of programmable analog array 10. In an alternative embodiment, the cells in the first, third, fifth, and seventh cells include the analog circuitry, and the cells in the second, fourth, and sixth columns include the digital circuitry.

FIG. 3 is a schematic diagram of an automatic gain control circuit 30 configured using two cells, 11A and 11B, in programmable analog array 10 of FIG. 1. Automatic gain control circuit 30 is configured using cells 11A and 11B in programmable analog array 10 in accordance with the cell configuration data and the interconnection data stored in RAM 22 of programmable analog array 10. Cells 11A and 11B can be any two cells 11 in programmable analog array 10. The analog circuitry of cell 11A is configured as an amplifier 33 in accordance with the cell configuration data stored in memory unit 16A. Amplifier 33 includes an operational amplifier 34, a feedback capacitor 35, and a capacitor 37. By way of example, capacitors 35 and 37 are switched capacitors. A non-inverting input of operational amplifier 34 is connected to a node 36 for receiving a voltage signal such as, for example, a ground voltage level. An inverting input of operational amplifier 34 is coupled to an input node 31 of cell 11A via switched capacitor 37. The inverting input of operational amplifier 34 is also coupled to an output of operational amplifier 34 via feedback capacitor 35. The output of operational amplifier 34 serves as an output of amplifier 33 and is coupled to an input node 41 of a peak detector 42 which is configured in cell 11B in accordance with the cell configuration data stored in memory unit 16B of cell 11B. An output node 43 of peak detector 42 is coupled to an inverting input of a comparator 46 which is configured in cell 11A. A non-inverting input of comparator 46 is connected to a node 45 for receiving a reference voltage.

In addition, a counter 48 is configured from the digital circuitry of cell 11A. A clock input of counter 48 is connected to a node 32 for receiving a clock signal. A control input node 47 of counter 48 is coupled to an output of comparator 46. A gating input node 44 of counter 48 is coupled to an equal mode output of comparator 46. An output node 49 of counter 48 is coupled through memory unit 16A to a control input of switched capacitor 37 for adjusting the component values in switched capacitor 37. Counter 48 is an up/down counter which can count upward or downward depending on the voltage level at control input node 47.

The gain of amplifier 33 is determined by the ratio of the capacitance of feedback capacitor 35 to that of switched capacitor 37. The capacitance of feedback capacitor 35 is determined in accordance with the cell configuration data stored in memory unit 16A. The capacitance of switched capacitor 37 has a default value determined in accordance with the cell configuration data. Therefore, the cell configuration data determines a default value for the gain of amplifier 33.

In operation, amplifier 33 receives an input signal from input node 31 of cell 11A and generates an output signal at input node 41 of peak detector 42. Peak detector 42 generates a peak voltage level at output node 43. The peak voltage level at output node 43 of peak detector 42 is equal to the peak value of the signal appearing at input node 41 of peak detector 42. The voltage level at output node 43 of peak detector 42 is transmitted to the inverting input of comparator 46, where the peak voltage level is compared with a reference voltage appearing at node 45.

If the peak voltage level is higher than the reference voltage at node 45, a logic low voltage level is generated at the output of comparator 46. The logic low voltage level is transmitted to control input node 47 of counter 48. Thus, counter 48 counts downward when triggered by the clock signal appearing at node 32. Output node 49 of counter 48 transmits the downward count of counter 48 to memory unit 16A. Upon receiving the downward count, memory unit 16A reconfigures switched capacitor 37, thereby reducing the capacitance of switched capacitor 37. Thus, the gain of amplifier 33 is reduced.

If the peak voltage level is lower than the reference voltage at node 45, a logic high voltage level is generated at the output of comparator 46. The logic high voltage level is transmitted to control input node 47 of counter 48. Thus, counter 48 counts upward when triggered by the clock signal appearing at node 32. Output node 49 of counter 48 transmits the upward count of counter 48 to memory unit 16A. Upon receiving the upward count, memory unit 16A reconfigures switched capacitor 37, thereby increasing the capacitance of switched capacitor 37. Thus, the gain of amplifier 33 is increased.

If the peak voltage level is substantially equal to the reference voltage at node 45, a logic signal is generated at the equal mode output of comparator 46 and transmitted to gating input node 44 of counter 48. Thus, counter 48 maintains a constant count. Output node 49 of counter 48 transmits the constant count of counter 48 to memory unit 16A. Upon receiving the constant count, memory unit 16A maintains the configuration of switched capacitor 37, thereby maintaining the capacitance of switched capacitor 37. Thus, the gain of amplifier 33 is unchanged.

Therefore, amplifier 33, peak detector 42, comparator 46, counter 48, and memory unit 16A form a digital feedback loop which adjusts the gain of amplifier 33 automatically so that the peak voltage level at the output of amplifier 33 is determined by the reference voltage at node 45. The feedback loop is established locally between cells 11A and 11B and does not use global data bus.

FIG. 4 is a schematic diagram of a phase locked loop 60 implemented using two cells, 11C and 11D, in programmable analog array 10 of FIG. 1. Phase locked loop 60 is configured using cells 11C and 11D in programmable analog array 10 in accordance with the cell configuration data and the interconnection data stored in RAM 22 of programmable analog array 10. Cells 11C and 11D can be any two cells in programmable analog array 10. The analog circuitry in cell 11C is configured as an oscillator 62 in accordance with the cell configuration data stored in memory unit 16C. An output node 65 of oscillator 62 is coupled to a clock input node 67 of a counter 68 which is configured from the digital circuitry of cell 11D in accordance with the cell configuration data stored in memory unit 16D. A control input of counter 68 is connected to a node 66 for receiving a voltage level such as, for example, a supply voltage $V_{DD}$. An output node 69 of counter 68 is connected to an input of a multiplexer (MUX) 72 which is configured in cell 11D. A logic gate 74 which is configured in cell 11D has a first input connected to an output node 73 of MUX 72 and a second input connected to input node 70 of cell 11D for receiving an input frequency signal. An output of logic gate 74 is connected to an input node 77 of a filter 78 which is configured in cell 11D. By way of example, logic gate 74 is an exclusive-OR gate and filter 78 is a low pass filter. An output node 79 of filter 78 is coupled to a non-inverting input of a comparator 86 which is configured in cell 11C. An inverting input of comparator 86 is connected to a node 85 for receiving a reference voltage, $V_{ref}$. An output of comparator 86 is coupled to an control input node 87 of a counter 88 configured in cell 11C. An equal mode output of comparator 86 is connected to a gating input node 84 of counter 88. A clock input node 64 of counter 88 is coupled for receiving a clock signal. An output node 89 of counter 88 is coupled via memory unit 16C to a control input of oscillator 62 for reconfiguring the variable connections within oscillator 62.

Oscillator 62 has an intrinsic output frequency determined by the cell configuration data stored in memory unit 16C. The intrinsic frequency of oscillator 62 is also referred to as the center frequency or free-running frequency of oscillator 62. In operation, the output signal of oscillator 62 is transmitted to clock input node 67 of counter 68. Because the control input of counter 68 receives a fixed voltage level $V_{DD}$, counter 68 always counts in one direction, e.g., upward. Thus, the signal at output node 69 of counter 68 has the same frequency as the signal at output node 65 of oscillator 62. MUX 72 generates a signal at output node 73, wherein the frequency of the signal at output node 73 is equal to the frequency at output node 65 of oscillator 62 divided by an integer N. For example, counter 68 is an eight bit counter. If the signal at output node 73 of MUX 72 is configured to be triggered by the fourth most significant bit of counter 68, the integer N will be equal to thirty-two. The output signal of MUX 72 and the input frequency signal at input node 70 are transmitted to the two inputs of exclusive-OR gate 74. If there is a phase shift between the signals at its two inputs, exclusive-OR gate 74 transmits a series of pulses to input node 77 of filter 78. Filter 78 generates a low frequency signal at output node 79 in accordance with the series of pulses at input node 77. Comparator 86 compares the signal at output node 79 of filter 78 with a reference voltage at node 85 and generates a logic voltage level depending on the phase and frequency relations between the signals at the two inputs of exclusive-OR gate 74.

If the frequency of the signal at output node 73 of MUX 72 is higher than the frequency of the input signal at input node 70, comparator 86 generates a first logic voltage level, e.g., a logic low voltage level at control input node 87 of counter 88. Thus, counter 88 counts downward when triggered by the clock signal appearing at clock input node 64. Output node 89 of counter 88 transmits the downward count of counter 88 to memory unit 16C. Upon receiving the downward count, memory unit 16C reconfigures the variable connections within oscillator 62, thereby decreasing the frequency of the signal at output node 65 of oscillator 62.

If the frequency of the signal at output node 73 of MUX 72 is lower than the frequency of the input signal at input node 70, comparator 86 generates a second logic voltage level, e.g., a logic high voltage level at control input node 87 of counter 88. Thus, counter 88 counts upward when triggered by the clock signal appearing at clock input node 64. Output node 89 of counter 88 transmits the upward count of counter 88 to memory unit 16C. Upon receiving the upward count, memory unit 16C reconfigures the variable connections within oscillator 62, thereby increasing the frequency of the signal at output node 65 of oscillator 62.

If the frequency of the signal at output node 73 of MUX 72 is substantially equal to the frequency of the input signal at input node 70, a logic signal is generated at the equal mode output of comparator 86 and transmitted to gating input node 84 of counter 88. Thus, counter 88 maintains a constant count. Output node 89 of counter 88 transmits the constant count of counter 88 to memory unit 16C. Upon receiving the constant count, memory unit 16C keeps the variable connections within oscillator 62 unchanged, thereby maintaining the frequency of the signal at output node 65 of oscillator 62.

Therefore, oscillator 62, counter 68, MUX 72, logic gate 74, filter 78, comparator 86, counter 88, and memory unit 16C form a digital feedback loop which reconfigures oscillator 62 so that the frequency of oscillator 62 is determined by the frequency of the input signal at input node 70. The feedback loop is established locally between cells 11C and 11D and does not use global data bus.

FIG. 5 is a flow chart 100 of a method for establishing a feedback loop for use with the programmable analog array 10 of FIG. 1. In a first step 102, a programmable analog array is formed on a single semiconductor integrated circuit chip. The programmable analog array comprises an input/output circuit and an array of cells. The cells are arranged in rows and columns. Analog circuitry and digital circuitry are formed in each cell of the array (step 104).

It should be understood that the cells in the array of the programmable analog array are not limited to being identical to each other in the present invention. The programmable analog array may include cells with structures different from one another. It should also be understood that, in the present invention, the analog circuitry and the digital circuitry are not limited to being formed in the same cell in the programmable analog array. For example, the analog circuitry and the digital circuitry can be formed in alternate cells in the programmable analog array.

In step 106, a switch circuit in each cell configures the analog circuitry and the digital circuitry in accordance with the cell configuration data stored in a storage element such as a RAM. These cell configuration data are continuously read to maintain the circuit configuration and component values of the analog circuitry and digital circuitry in the cells. The cell configuration data stored in the RAM can be reconfigured from an external source in order to implement new circuits within the array of cells for new functional applications. The cell configuration data are accessed to configure the analog circuitry and the digital circuitry of the cells using, for example, two programming shift registers and a control circuit. One programming shift register provides a row coordinate reference signal, and the other programming shift register provides a column coordinate reference signal. The row and column coordinate reference signals permit individually accessing and configuring each cell in the programmable analog array.

In step 108, interconnection between different cells in the array is established through interconnection circuitry in accordance with interconnection data stored in the RAM. The configuration of each cell in the array and the interconnection among different cells in the array determine the functional applications of the programmable analog array.

After a programable integrated circuit is successfully configured (step 106) and interconnected (step 108), the analog circuitry and the digital circuitry form a digital feedback loop. The analog circuitry generates an analog signal (step 112), which is transmitted to the digital circuitry. The digital circuitry converts the received analog signal into digital control information (step 114). The digital control information is then used to adjust the analog circuitry by reconfiguring the variable connections and/or varying the component values of the analog circuitry (step 116). It should be understood that the analog circuitry in one cell in the array is not limited to being adjusted by the digital circuitry of the same cell in the present invention. A digital feedback loop may be formed among two or more cells in the programmable analog array.

By now it should be appreciated that a programable analog array and a method for establishing a feedback loop have been provided. The programable analog array includes an array of cells. Each cell includes analog circuitry and digital circuitry. After the cells are configured and interconnected with one another to implement a functional application, the digital circuitry converts an analog signal received from the analog circuitry into digital control information, which is then used to adjust the analog circuitry. Because the feedback loop is established locally within one cell or among a few cells, the programable analog array in accordance with the present invention can be implemented with a minimum number of global data bus. Therefore, the present invention provides a semiconductor integrated circuit chip that is reliable, small in size, and cost efficient.

We claim:

1. A programmable analog array, comprising:
   an array of cells, a plurality of cells in the array of cells including analog circuitry which is configurable as a plurality of circuit functions and digital circuitry which converts an analog signal received from the analog circuitry into digital information;
   a local feedback loop established within the array of cells the local feedback loop reconfiguring the analog circuitry in accordance with the digital information;
   interconnection circuitry coupled to the array of cells, wherein the interconnection circuitry enables interconnection of different cells in the array of cells; and
   an accessing circuit, wherein the accessing circuit selectively accesses a first cell of the plurality of cells, transmits cell configuration data to the first cell to internally configure the first cell as one of the plurality of circuit functions, and transmits interconnection data to the interconnection circuitry.

2. The programable analog array of claim 1, wherein the local feedback loop is established between the first cell and a second cell of the plurality of cells, the first cell and the second cell being coupled to each other via the interconnection circuitry.

3. The programmable analog array of claim 1, wherein the local feedback loop is established within the first cell.

4. The programable analog array of claim 1, wherein the first cell further includes a memory unit for storing the cell configuration data of the first cell.

5. The programmable analog array of claim 1, wherein the first cell further includes switch circuitry, and wherein the switch circuitry configures the analog circuitry of the first cell in accordance with the cell configuration data.

6. The programable analog array of claim 1, wherein the accessing circuit includes a data storage element for storing the cell configuration data and for storing the interconnection data.

7. The programable analog array of claim 1, wherein the first cell includes switch circuitry, and wherein the switch circuitry configures the digital circuitry of the first cell in accordance with the cell configuration data.

8. The programmable analog array of claim 1, wherein analog circuitry of the first cell includes:
   an operational amplifier; and
   an analog circuit element coupled to the operational amplifier, the analog circuit element having internal components, wherein the internal components have component values and are interconnected.

9. The programmable analog array of claim 1, wherein the first cell and a second cell of the plurality of cells are configured to produce an automatic gain control circuit, and wherein the automatic gain control circuit includes:
   an amplifier configured from analog circuitry of the first cell, wherein the amplifier has an input coupled for receiving an input signal, a control input, and an output;
   a peak detector configured from analog circuitry of the second cell, wherein the peak detector has an input coupled to the output of the amplifier, and an output;
   a comparator configured from the analog circuitry of the first cell, wherein the comparator has an inverting input coupled to the output of the peak detector, a non-inverting input coupled for receiving a reference voltage, a first output and a second output; and
   a counter configured from digital circuitry of the first cell, wherein the counter has a clock input coupled for receiving a clock signal, a first control input coupled to the first output of the comparator, a second control input coupled to the second output of the comparator, and an output coupled to the control input of the amplifier.

10. The programmable analog array of claim 1, wherein the first cell and a second cell of the plurality of cells are configured to produce a phase locked loop, and wherein the phase locked loop includes:
   an oscillator configured from analog circuitry of the first cell, wherein the oscillator has an input and an output;

a first counter configured from digital circuitry of the second cell, wherein the first counter has a clock input coupled to the output of the oscillator, a control input coupled for receiving a first voltage, and an output;

a multiplexer configured from the digital circuitry of the second cell, wherein the multiplexer has an input coupled to the output of the first counter, and an output;

a logic gate configured from the digital circuitry of the second cell, wherein the logic gate has a first input coupled to the output of the multiplexer, a second input coupled for receiving an input signal, and an output;

a filter configured from analog circuitry of the second cell, wherein the filter has an input coupled to the output of the logic gate, and an output;

a comparator configured from the analog circuitry of the first cell, wherein the comparator has a non-inverting input coupled to the output of the filter, an inverting input coupled for receiving a reference voltage, a first output, and a second output; and a second counter configured from digital circuitry of the first cell, wherein the second counter has a clock input coupled for receiving a clock signal, a first control input coupled to the first output of the comparator, a second control input coupled to the second output of the comparator, and an output coupled to the input of the oscillator.

11. A programmable analog array, comprising:

an array of cells, a plurality of cells in the array of cells including:
    analog circuitry with variable connections and variable component values;
    digital circuitry;
    a memory unit for storing cell configuration data; and
    switch circuitry, wherein the switch circuitry configures the analog circuitry and the digital circuitry in accordance with the cell configuration data;

interconnection circuitry coupled to the array of cells, wherein the interconnection circuitry enables an interconnection of a cell in the array of cells with at least one other cell in the array of cells;

a local feedback loop established between said analog circuitry and said digital circuitry within the array of cells; and an accessing circuit coupled to the interconnection circuitry, wherein the accessing circuit selectively accesses said cell in the array of cells, transmits the cell configuration data to the cell to internally configure the cell as one of the plurality of circuit functions, and transmits interconnection data to the interconnection circuitry.

12. The programmable analog array of claim 11, wherein the local feedback loop is established between a first cell of the plurality of cells and a second cell of the plurality of cells, digital circuitry of the second cell converts an analog signal received from analog circuitry of the first cell to digital information for altering the variable connections and adjusting the variable component values of the analog circuitry of the first cell.

13. The programmable analog array of claim 11, wherein the accessing circuit includes a data storage element for storing the cell configuration data for said first cell of the array of cells and for storing the interconnection data.

14. A method for establishing a feedback loop, comprising the steps of:

forming an array of cells;

forming analog circuitry in first cells in the array of cells;

forming digital circuitry in second cells in the array of cells;

configuring the analog circuitry and the digital circuitry in a first selected cell and a second selected cell in the array of cells, respectively, generating an analog signal in the analog circuitry in the first selected cell;

transmitting the analog signal directly to the digital circuitry in the second selected cell;

generating digital control information using the analog signal;

transmitting the digital control information directly to the analog circuitry in the first selected cell; and altering variable connections and adjusting component values of the analog circuitry in the first selected cell in accordance with the digital control information.

15. The method for establishing a feedback loop as claimed in claim 14, further comprising the step of interconnecting the first selected cell to the second selected cell.

16. The method for establishing a feedback loop as claimed in claim 14, wherein the first selected cell is the same cell as the second selected cell.

17. The method for establishing a feedback loop as claimed in claim 14, wherein the step of configuring the analog circuitry and the digital circuitry includes the steps of:

storing cell configuration data in a memory unit; and configuring the analog circuitry and the digital circuitry in accordance with the cell configuration data stored in the memory unit.

18. The method for establishing a feedback loop as claimed in claim 14, further comprising the steps of:

generating a second analog signal in the analog circuitry in the second selected cell; and transmitting the second analog signal directly to the digital circuitry in the first selected cell.

19. The method for establishing a feedback loop as claimed in claim 14, wherein the step of configuring the analog circuitry and digital circuitry includes the steps of:

configuring an amplifier from the analog circuitry of the first selected cell, wherein the amplifier has an input for receiving an input signal;

configuring a peak detector from the analog circuitry of the second selected cell;

coupling an input of the peak detector to an output of the amplifier;

configuring a comparator from the analog circuitry of the first selected cell, wherein the comparator has a non-inverting input coupled for receiving a reference voltage;

coupling an inverting input of the comparator to an output of the peak detector;

configuring a counter from the digital circuitry of the first selected cell, wherein the counter has a clock input coupled for receiving a clock signal;

coupling a first control input of the counter to a first output of the comparator;

coupling a second control input of the counter to a second output of the comparator; and coupling an output of the counter to a control input of the amplifier for adjusting a gain of the amplifier by reconfiguring the amplifier.

20. The method for establishing a feedback loop as claimed in claim 14, wherein the step of configuring the analog circuitry and the digital circuitry includes the steps of:

configuring an oscillator from the analog circuitry of the first selected cell;

configuring a first counter from the digital circuitry of the second selected cell, wherein the first counter has a control input coupled for receiving a first voltage;

coupling a clock input of the first counter to an output of the oscillator;

configuring a multiplexer from the digital circuitry of the second selected cell;

coupling an input of the multiplexer to an output of the first counter;

configuring a logic gate from the digital circuitry of the second selected cell, wherein the logic gate has a first input coupled for receiving an input signal;

coupling a second input of the logic gate to an output of the multiplexer;

configuring a filter from the analog circuitry of the second selected cell;

coupling an input of the filter to an output of the logic gate;

configuring a comparator from the analog circuitry of the first selected cell, wherein the comparator has an inverting input coupled for receiving a reference voltage;

coupling a non-inverting input of the comparator to an output of the filter;

configuring a second counter from the digital circuitry of the first selected cell, wherein the second counter has a clock input coupled for receiving a clock signal;

coupling a first control input of the second counter to a first output of the comparator;

coupling a second control input of the second counter to a second output of the comparator; and coupling an output of the second counter to a control input of the oscillator for adjusting a frequency of the oscillator by reconfiguring the oscillator.

\* \* \* \* \*